(12) United States Patent
Amann et al.

(10) Patent No.: US 7,809,348 B2
(45) Date of Patent: Oct. 5, 2010

(54) COMPENSATING CIRCUIT FOR A MIXER STAGE

(75) Inventors: Michael Amann, Murr (DE); Thorsten Fahlbusch, Heilbronn (DE); Leo Friesen, Necharsulm (DE); Andreas Leistner, Flein (DE); Juergen Schnabel, Leingarten (DE)

(73) Assignee: Atmel Automotive GmbH, Heilbronn (DE)

( * ) Notice: Subject to any disclaimer, the term of this patent is extended or adjusted under 35 U.S.C. 154(b) by 549 days.

(21) Appl. No.: 11/889,986

(22) Filed: Aug. 17, 2007

(65) Prior Publication Data

US 2008/0070538 A1 Mar. 20, 2008

Related U.S. Application Data

(60) Provisional application No. 60/838,377, filed on Aug. 18, 2006.

(30) Foreign Application Priority Data

Aug. 17, 2006 (DE) .................. 10 2006 039 704

(51) Int. Cl.
*H04Q 1/10* (2006.01)
*H04Q 1/40* (2006.01)

(52) U.S. Cl. ...................... 455/326; 455/296

(58) Field of Classification Search ................ 455/296, 455/313, 323, 324, 326, 333, 334
See application file for complete search history.

(56) References Cited

U.S. PATENT DOCUMENTS 6,704,559 B1 * 3/2004 Hageraats .................... 455/326
6,856,796 B2 * 2/2005 Ding et al. .................... 455/295
6,944,438 B2 * 9/2005 Pellat et al. .................. 455/333
2003/0007377 A1 1/2003 Otaka
2005/0231283 A1 10/2005 Perry
2006/0040633 A1 2/2006 Watanabe et al.
2007/0037544 A1 * 2/2007 Heikkinen ................... 455/323

OTHER PUBLICATIONS

Otaka et al., "A-10-dBm IIP3 SiGe Mixer With IM3 Cancellation Technique", IEEE Journal of Solid-State Circuits, vol. 39, No. 12, Dec. 2004, pp. 2333-2341.

* cited by examiner

*Primary Examiner*—Blane J Jackson
(74) *Attorney, Agent, or Firm*—Muncy, Geissler, Olds & Lowe, PLLC

(57) ABSTRACT

A compensating circuit for a mixer stage is provided, wherein the mixer stage has an input stage to which an input signal for mixing can be applied and has, following the input stage, a switching stage for mixing a differential input signal—obtained from the input stage as a function of the input signal—with an oscillator signal, wherein the input of the compensating circuit can be connected to an input signal terminal of the input stage and the output of the compensating circuit can be connected to an input signal terminal of the switching circuit at which the differential input signal obtained by means of the input stage is present, and wherein a compensating signal obtained by means of a compensating stage of the compensating circuit, in particular for compensating intermodulation products, can be produced by the compensating circuit at its output. The compensating circuit has a compensating input stage with means for influencing an amplitude and/or phase of the input signal, by which means the compensating stage can be supplied with a modified input signal.

9 Claims, 2 Drawing Sheets

COMPENSATING CIRCUIT FOR A MIXER STAGE

This nonprovisional application claims priority to German Patent Application No. DE 102006039704, which was filed in Germany on Aug. 17, 2006, and to U.S. Provisional Application No. 60/838,377, which was filed on Aug. 18, 2006, and which are both herein incorporated by reference.

BACKGROUND OF THE INVENTION

1. Field of the Invention

The present invention relates to a compensating circuit for a mixer stage, wherein the mixer stage has an input stage to which an input signal for mixing can be applied and has, following the input stage, a switching stage for mixing a differential signal—obtained from the input stage as a function of the input signal—with an oscillator signal, wherein the input of the compensating circuit can be connected to an input signal terminal of the input stage and the output of the compensating circuit can be connected to an input signal terminal of the switching circuit at which the differential input signal obtained by the input stage is present, and wherein a compensating signal obtained by a compensating stage of the compensating circuit, in particular for compensating intermodulation products, can be produced by the compensating circuit at its output. The invention further relates to a mixer stage with a compensating circuit.

2. Description of the Background Art

Compensating circuits of the aforementioned type are known and are used in mixer stages that operate on the basis of the principle of the Gilbert cell, for example, in order to compensate for unwanted intermodulation products, in particular third-order intermodulation products, which are also called IM3 intermodulation products.

Such a mixer stage, which has associated with it a compensating circuit containing a differential stage, is known from the document "A+10-dBm IIP3 SiGe Mixer With IM3 Cancellation Technique" by Shoji Otaka et al, IEEE Journal of Solid-State Circuits, Vol. 39, No. 12, December 2004, p 2333. The described differential stage produces an IM3 signal that is added with a 180° phase shift to a differential input signal for the switching stage in order to compensate for the relevant intermodulation product at the input of the switching stage. The IM3 signal produced by the prior art compensating circuit is adjusted with regard to its amplitude as a function of a bias current for the relevant differential stage and as a function of a resistor used to implement negative feedback.

In addition to the systems described, mixers that have a compensating circuit with its own mixer stage, and that have a correspondingly complex structure, are also known.

SUMMARY OF THE INVENTION

It is therefore an object of the present invention to provide a compensating circuit such that unwanted intermodulation products, in particular of the third order, can be reliably compensated over a wide range of operating parameters of the compensating circuit, in particular a wide operating frequency range and/or operating temperature range.

This object is attained according to the invention with a compensating circuit of the aforementioned type in that the compensating circuit has a compensating input stage with means for influencing an amplitude and/or phase of the input signal, by which means the compensating stage can be supplied with a modified input signal.

Accordingly, the inventive compensating input stage makes it possible to influence the signal supplied to the compensating stage, from which signal the signal components required for compensation, for example an IM3 signal, are ultimately obtained. As compared to the prior art systems, additional degrees of freedom are thus advantageously obtained at one time with regard to the formation of the IM3 signal as well as with regard to other signals necessary for compensation; these degrees of freedom go beyond the simple setting of a bias current in compensating circuits that are designed as, e.g., differential stages, thus offering increased flexibility.

An important advantage of the inventive compensating input stage is that in a compensating stage designed as, e.g., a differential stage, it is possible to set the amplitude of the input signal or modified input signal in a manner that is independent of the bias current. Thus, the setting of an appropriate bias current can be used to predetermine parameters including the dynamic range or power dissipation of the differential stage, while the amplitude of the IM3 signal to be produced can be predetermined through the amplitude of the input signal, which is controllable by means of the compensating input stage. In other words, the invention permits optimal matching of a level of the input signal to a compensating stage that is used or to a differential stage contained therein.

In an embodiment of the inventive compensating circuit, a voltage divider can be provided in the compensating input stage, permitting in particular the influencing of an amplitude of the input signal.

According to another aspect of the invention, the voltage divider can have resistive and/or capacitive components, so that in particular it is possible to influence the phase of the input signal delivered to the compensating input stage. Although the use of inductive components in the inventive compensating circuit is also possible in principle, configurations with resistive and/or capacitive components are preferably used in order to ensure a small space requirement and a commensurately good integratability of the inventive compensating circuit.

A further increase in the flexibility of the inventive compensating circuit is provided in that at least one resistive and/or capacitive component of the voltage divider is designed to be controllable. To this end, for example, it is possible to provide multiple resistive or capacitive components that can be connected to one another in different ways by means of a switch matrix. Alternatively or in addition, MOS transistors can also be used as controllable resistive elements, for example.

Insofar as the compensating input stage is designed to process a differential input signal, provision can be made according to the invention that the voltage divider is designed to be symmetrical or asymmetrical. In particular, an asymmetrical design of the voltage divider provides an additional degree of freedom in matching the inventive compensating circuit to individual operating conditions.

An optimal matching of the inventive compensating circuit to the largest possible operating frequency range can be achieved by the means that the voltage divider has a predefinable frequency response, by which means it is possible, for example, to balance out the effect of parasitic capacitances of the compensating circuit, in particular of a differential stage following the compensating input stage.

In order to ensure the most efficient production of intermodulation products by the compensating circuit, provision is made in another variation of the present invention that the compensating stage is designed as a differential stage or has a differential stage, and that the differential stage has no negative feedback. The proportion of intermodulation products produced in the differential stage is maximal in this configuration. Alternatively, a negative feedback that is preferably relatively weak can also be provided in the differential stage.

In another aspect of the invention having a compensating stage designed as a differential stage, the differential stage can be supplied with a predefinable bias current, for example through a controllable current source, so that the amplitude of the inventively produced intermodulation products can be controlled by this means.

A temperature dependence of the bias current can be predefined in order to compensate for any existing temperature dependence of additional components.

The elements of a voltage divider provided in the compensating input stage can also be selected with regard to their temperature response in order to implement a predefinable temperature-dependent voltage division ratio.

In a further object of the present invention, a mixer stage for mixing an input signal with an oscillator signal is specified that has an inventive compensating circuit.

In general, the components of the mixer stage—implemented in the form of a Gilbert cell, for example—as well as the components of the inventive compensating circuit, in particular differential stages and the switching stage of the mixer stage, can also be implemented by means of MOS transistors as well as bipolar transistors. The use of a BiCMOS technology to implement the inventive mixer stage is also possible.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
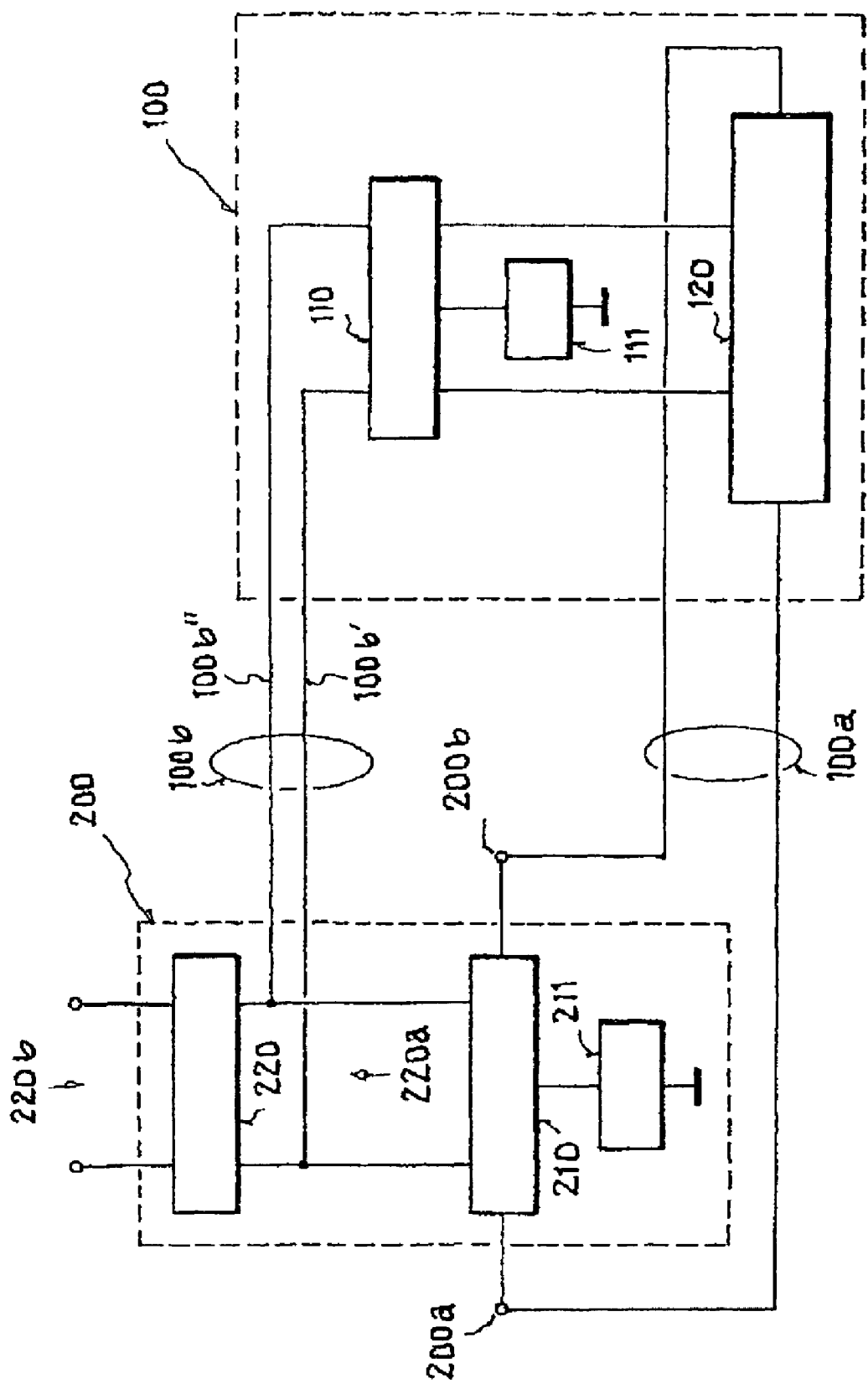
FIG. 1 is a block diagram of an embodiment of an inventive mixer stage.

FIG. 1 shows a block diagram of the inventive mixer circuit 200. The mixer stage 200 has two input signal terminals 200a, 200b through which it can be supplied with an input signal to be mixed. In the example embodiment described here, the input stage 210 of the mixer stage is designed as a conventional differential stage, so that the input signal terminals 200a, 200b can preferably be supplied with a differential signal.

It is also possible to supply the mixer stage shown in FIG. 1 with a non-differential input signal, wherein such an input signal is supplied to only one of the input signal terminals 200a, 200b in a manner that is known per se, while the other input signal terminal 200a, 200b is correspondingly connected to a predefinable reference voltage.

As can be seen from FIG. 1, the input stage 210 is followed by a switching stage 220, to which an oscillator signal (not shown) can be supplied. The switching stage 220 performs a multiplicative mixing in a known manner of the differential input signal supplied to it by the input stage 210 with the oscillator signal, and together with the input stage implements a Gilbert cell. Accordingly, the mixed output signal is available at the output 220b of the switching stage 220.

In order to compensate for intermodulation products produced especially at the input stage 210 of the mixer stage 200, in particular third-order intermodulation products, which are also called IM3 intermodulation products, the inventive compensating circuit 100, which is likewise shown in FIG. 1, is associated with the mixer stage 200.

An input 100a of the compensating circuit 100 is connected directly to the input signal terminals 200a, 200b of the input stage 210 so that the inventive compensating circuit 100 has the same differential input signal supplied to it as the mixer stage 200.

The compensating circuit 100 has a compensating stage 110 which—like the input stage 210—is preferably designed as a conventional differential stage and accordingly produces comparable intermodulation products as a function of the differential input signal, which in turn are present at the output 100b of the compensating stage 110 in the form of a differential signal.

The output 100b of the compensating stage 110 simultaneously constitutes the output of the compensating circuit 100, and is connected to an input signal terminal 220a of the switching stage 220 so that an output signal of the compensating circuit 100 represented by appropriate currents is added to the output signal of the input stage 210. The individual output lines 100b', 100b'' of the output 100b are swapped in terms of their polarity relative to the output lines of the input stage 210, so that the output signal of the compensating circuit 100 is added with a 180° phase shift to the output signal of the input stage 210. This results in a compensation of the intermodulation products produced by the input stage 210, in particular the IM3 products.

As is known, an amplification of the components 210, 110 of processed signals that take the form of differential stages can be controlled through a bias current (among other means), which is supplied by appropriately associated current sources 211, 111, which likewise are illustrated in FIG. 1. In particular, by appropriately setting the bias current supplied to the compensating stage 110, it is possible to control the amplitude of the IM3 products that are used for compensation in the aforementioned addition of the output signals of the components 110, 210.

Additional degrees of freedom in the production of intermodulation products used for compensation, in particular of the IM3 products, are provided in the inventive compensating circuit 100 in advantageous fashion by a compensating input stage 120 ahead of the compensating stage 110. To this end, the compensating input stage 120 includes means for influencing the amplitude and/or phase of the input signal supplied to it through the input 100a. In other words, the compensating input stage 120 provided in accordance with the invention makes it possible to adjust the amplitude of the input signal supplied to the compensating stage 110, which accordingly is referred to hereinafter as a modified input signal.

As a result of supplying the compensating stage 110 with an input signal, modified with respect to its amplitude for example, it is possible to select the bias current for the compensating stage 110 largely independently of the amplitude of the input signal available at the input 100*a*, for example in order to correspond to additional operating criteria such as a desired power dissipation etc., and nevertheless to achieve a predefinable amplification within the compensating circuit 100 overall in order to be able to provide IM3 products with the amplitude required for compensation at the output 100*b*.

Figure 2:
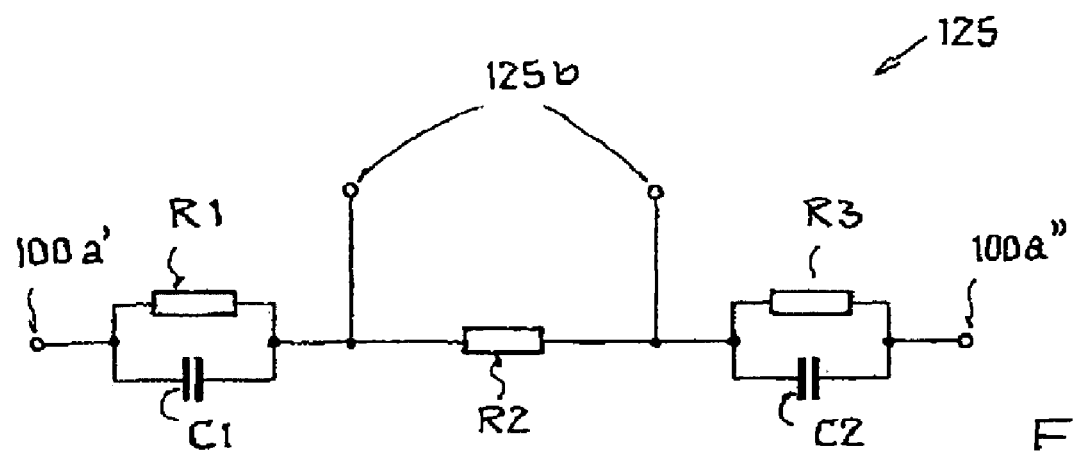
FIG. 2 is a block diagram of an embodiment of a voltage divider for an inventive compensating circuit.

Preferably the compensating input stage 120 has a voltage divider 125, which for the case of differential input signals has the configuration illustrated in FIG. 2, for example, and is connected directly to the terminals 100*a*', 100*a*" of the input 100*a*.

As can be seen from FIG. 2, the voltage divider 125 has multiple resistive elements composed of ohmic resistors R1, R2, R3, for example, which together with capacitive elements that likewise are advantageously provided and are designed, for example, as capacitors C1, C2, determine the amplitude and phase of the signal that is supplied to the compensating stage 110 (FIG. 1) through the differential output 125*b*.

The component values of the ohmic resistors R1, R2, R3 and capacitors C1, C2 are advantageously chosen such that the voltage divider 125 implements a voltage division ratio over as large a portion as possible of the operating frequency range of the mixer stage 200 (FIG. 1) in such a manner as to result in a desired amplitude and phase of the IM3 products used for compensation at the output 100*b*, in order to permit optimal compensation.

In particular, the influence of parasitic capacitances of the compensating circuit 100, especially in the area of an input of the compensating stage 110, can also be balanced out by an appropriate design of the voltage divider 125.

In addition to ohmic resistors R1, R2, R3, it is also entirely possible in general to use other components, such as field effect transistors, to implement resistive elements. The possibility of a voltage division ratio that is dynamically adjustable through appropriate control of the field effect transistors is especially advantageous here, and makes it possible to balance the voltage divider 125 during operation of the mixer stage 200, among other things.

A switch matrix for selectable connection of different elements of the voltage divider 125 to one another can also be used to permit dynamic matching of the voltage divider 125.

In addition to a symmetrical design of the voltage divider 125, an asymmetric design is also possible, in particular to balance out any existing deviations or asymmetries of the remainder of the compensating circuit 100.

In an especially advantageous embodiment of the invention, the differential stage used to implement the compensating stage 110 has no negative feedback, thus ensuring that a maximum generation of IM3 products required for compensation is provided with a relatively small amplification for an information signal. This measure advantageously contributes to maximizing the distance of, e.g., the 1 dB compression point from the intercept point IP3.

An implementation of the compensating stage 110 with negative feedback is likewise possible, wherein preferably a negative feedback is chosen that is relatively small in comparison to the negative feedback predefined in the input stage 210.

For negligible or very small negative feedback in the compensating stage 110, it is possible for the differential stage of the compensating stage 110 to clip while the mixer stage 200 is still in the linear region. This has the consequence that, for low input levels of the differential input signal to be mixed, the greatest proportion of the intermodulation products is produced in the compensating stage 110. This is not desirable.

For larger input levels of the differential input signal, it is possible that the differential stage of the compensating stage 110 is already so deeply in compression that it no longer fulfills its task of generating a defined compensating signal. The overall performance of a conventional mixer stage can be strongly degraded by the effects described above. In contrast to the prior art systems, the inventive voltage divider 125 in the compensating circuit 100 provides for optimal matching of the level of the differential input signal by appropriately dividing down the differential input signal while simultaneously making maximum utilization of the potential for producing intermodulation products by the compensating stage 110, thus avoiding the problems arising in the conventional mixer stages.

In another advantageous embodiment of the present invention, provision is made that the current source 111 supplies the compensating stage 110 with a bias current that has a predefinable temperature dependence in order to compensate a temperature response of the other components, in particular of a differential stage present in the compensating stage 110.

The mixer stage 200 associated with the inventive compensating circuit 100 (FIG. 1) does not necessarily have to have the structure of a Gilbert cell. In particular, in the completely general case, any desired circuit arrangement that performs the frequency conversion necessary for mixing can be used for the switching stage 220. Due to the inventive provision of the compensating signal to the input side 220*a* of the switching stage 220 or to a circuit 220 that performs the frequency conversion, it is advantageously ensured that the switching stage 220 or a frequency-converting circuit 220 need only process a signal that has already been compensated and has already been freed of the unwanted modulation products.

The inventive compensating circuit 100 can be used to advantage in all mixer stages in which the compensating signal that is produced at the output of the compensating circuit 100 can be injected ahead of a switching stage 220 or another circuit provided for frequency conversion. The effort required to integrate the inventive compensating circuit 100 into an existing mixer stage is relatively small, since all that is needed in addition to supplying the compensating signal of the compensating circuit 100 at its input 100*a* is to supply the differential input signal that is also provided to the mixer stage 200.

Figure 3A:
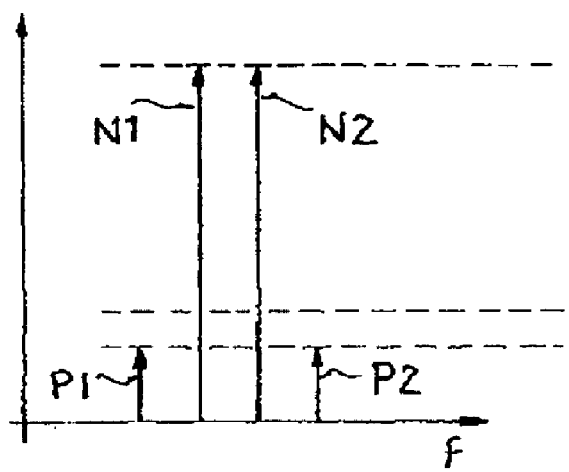
FIG. 3a is a spectral plot of the information signal and intermodulation signal components arising in the mixer stage from FIG. 1.

By way of example the spectral plot in FIG. 3*a* shows two information signals N1, N2 with adjacent frequencies along with corresponding third order intermodulation products, which is to say IM3 products P1, P2 such as are obtained at the output of the input stage 210 of the inventive mixer stage 200.

Figure 3B:
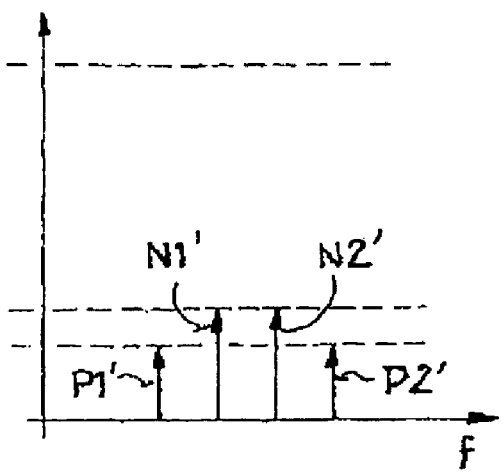
FIG. 3b is a spectral plot of the information signal and intermodulation signal components arising in the compensating stage.

The spectral plot in FIG. 3*b* shows the information signals N1', N2' generated by the inventive compensating circuit 100 along with IM3 products P1', P2', such as are obtained at the output 100*b* of the compensating stage 110. The phase-inverted addition of the signals generated by the compensating circuit 100 (FIG. 3*b*) to the output signals (FIG. 3*a*) of the input stage 210 as described above results in an effective compensation of the undesirable IM3 products P1, P2, while the information signals N1, N2 are damped only insignificantly because the amplitudes of the information signals N1', N2' contained in the compensating signal (FIG. 3*b*) are relatively small due to the inventive generation of the compensating signal.

Consequently, essentially no IM3 products are present at the input of the switching stage 220 of the mixer stage 200.

Overall, the inventive compensating circuit 100 permits the design of mixer stages 200 that have a large IP3 intercept point and a large separation of the IP3 intercept point from a corresponding compression point, as well as improved flexibility in the generation of compensating signals.

The inventive circuit principle for the compensating circuit 100 can be used in conventional mixers or mixer stages without image frequency suppression as well as in mixers or mixer stages with image frequency suppression (image rejection mixers).

In particular, the present invention makes it possible to provide existing mixer designs with IM3 compensation unchanged and without redimensioning, in that the mixer design in question is augmented by the inventive compensating circuit 100. The mixer or mixer stage itself, whose IP3 is improved by the employment of the inventive compensating circuit 100, can be maintained unchanged, and can also be operated without IM3 compensation by deactivating the compensating circuit 100, which, for example, can be implemented through switchable input and output terminals 100a, 100b.

The invention offers a considerable improvement in the linearity characteristics of existing mixers with minimal circuit design effort, since the compensating circuit 100 has very small dimensions, i.e. a very small chip area requirement, and can be operated with very low bias currents. As a result, the inventive compensating circuit 100 is easy to integrate and can be integrated into existing mixer layouts.

The described frequency response compensation by the voltage divider 125 of the compensating circuit 100 ensures a correct phase position of the compensation signal at the output 100b and has the effect that the IM3 compensation operates over a large frequency range.

The input level for the differential input signal at which a best possible extinction of IM3 products is achieved can be adjusted in a variable manner by setting an appropriate bias current of the current source 111 and/or setting the voltage division ratio of the inventive voltage divider 125, which is also dynamically variable.

According to investigations by the applicant, the inventive compensating circuit 100 has no significant effects on important parameters of the mixer stage 200 such as its noise figure and gain, for example.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A compensating circuit for a mixer stage, wherein the mixer stage has an input stage having first and second input signal terminals to which an input signal for mixing is applied and has, following the input stage, a switching stage for mixing a differential input signal, which is obtained from the input stage as a function of the input signal, with an oscillator signal, the compensating circuit comprising:
   an input connected to the first and second input signal terminals of the input stage;
   an output connected to an input signal terminal of the switching stage at which the differential input signal obtained by the input stage is present;
   a compensating stage for compensating intermodulation products which provides a compensating signal at the output of the compensating circuit; and
   a compensating input stage having a voltage divider for influencing an amplitude and/or phase of the input signal,
   wherein the compensating input stage is configured to supply a modified input signal to the compensating stage, and
   wherein the voltage divider is connectable to the first and second input signal terminals of the input stage.

2. The compensating circuit according to claim 1, wherein the voltage divider has resistive and/or capacitive components.

3. The compensating circuit according to claim 2, wherein at least one resistive and/or capacitive component of the voltage divider is controllable.

4. The compensating circuit according to claim 1, wherein the compensating input stage is designed to process a differential input signal, and wherein the voltage divider is designed to be asymmetrical.

5. The compensating circuit according to claim 1, wherein the voltage divider has a predefinable frequency response.

6. The compensating circuit according to claim 1, wherein the compensating stage is designed as a differential stage and has no negative feedback.

7. The compensating circuit according to claim 1, wherein the compensating stage is designed as a differential stage and the differential stage is supplied with a predefinable bias current.

8. The compensating circuit according to claim 7, wherein a temperature dependence of the bias current is predefined.

9. A mixer stage for mixing an input signal with an oscillator signal, the mixer stage comprising:
   an input stage to which an input signal for mixing is applied;
   a switching stage for mixing a differential input signal, which is obtained from the input stage as a function of the input signal, with an oscillator signal; and
   a compensating circuit comprising:
   an input connected to an input signal terminal of the input stage;
   an output connected to an input signal terminal of the switching circuit at which the differential input signal obtained by the input stage is present;
   a compensating stage for compensating intermodulation products which provides a compensating signal at an output of the compensating circuit; and
   a compensating input stage for influencing an amplitude and/or phase of the input signal wherein the compensating input stage is configured to supply a modified input signal to the compensating stage.

* * * * *